US007705517B1

(12) United States Patent
Koen et al.

(10) Patent No.: US 7,705,517 B1

(45) Date of Patent: Apr. 27, 2010

(54) ULTRASOUND TRANSMITTER

(75) Inventors: Myron J. Koen, Tucson, AZ (US); Ismail H. Oguzman, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 12/261,209

(22) Filed: Oct. 30, 2008

(51) Int. Cl.
*H01L 41/09* (2006.01)

(52) U.S. Cl. ...................................................... 310/317

(58) Field of Classification Search .................. 310/317
See application file for complete search history.

(56) References Cited

U.S. PATENT DOCUMENTS 4,044,297 A * 8/1977 Nobue et al. ................ 323/271
4,282,535 A * 8/1981 Kern et al. .................... 347/10
6,218,765 B1 * 4/2001 Kawabe ...................... 310/317

OTHER PUBLICATIONS

B. Haider, "Power Drive Circuits for Medical Diagnostic Medical Ultrasound," IEEE Proceedings of the 18th international Symposium on Power Semiconductor Devices and ICs, Jun. 2006.
M. A. Averkiou, D. N. Roundhill and J. E. Powers, "A New Imaging Technique Based on the Nonlinear Properties of Tissues," IEEE Ultrasonics Symposium, 1997.
B. Haider and R. Y. Chiao, "Higher Order Nonlinear Ultrasonic Imaging," IEEE Ultrasonics Symposium, 1999.

* cited by examiner

*Primary Examiner*—Thomas M Dougherty
(74) *Attorney, Agent, or Firm*—Steven A. Shaw; W. James Brady; Frederick J. Telecky, Jr.

(57) ABSTRACT

A system and method for providing a high voltage ultrasonic drive signal from an ultrasound transmitter are disclosed herein. An ultrasound transmitter includes a first plurality of drive transistors. A bias network is coupled to at least one transistor of the first plurality of drive transistors. A first switch is coupled to the bias network. The first switch selectively connects a first voltage to the bias network. The first switch is closed when generating an ultrasonic drive signal. The first switch is open when the transmitter is not generating an ultrasonic drive signal.

20 Claims, 3 Drawing Sheets

ULTRASOUND TRANSMITTER

CROSS REFERENCE TO RELATED APPLICATIONS

This application contains subject matter that may be related to U.S. patent application Ser. No. 12,261,185, entitled "Low Power Continuous Wave Ultrasound Transmitter", U.S. patent application Ser. No. 12/261,252, entitled "Ultrasound Transmitter", and U.S. patent application Ser. No. 12/261,269, entitled "Ultrasound Transmitter".

BACKGROUND

Ultrasonic imaging has become a widely used tool in medical applications. Ultrasound techniques introduce high-frequency acoustic waves into a subject's body. The received echoes of those waves provide information allowing a trained observer to view the subject's internal organs. Ultrasound imaging equipment uses transducers that convert electrical energy into acoustic energy. Piezo-electric crystals are one commonly used type of electrical to acoustical transducer. To obtain a clear image, a high signal to noise ratio is desirable to overcome random noise associated with the imaging process. One way to increase the signal-to-noise ratio is to increase the amplitude of the signal driving the transducer. Generally, the transducer drive signal may require voltages in the range of +/−75 volts to +/−100 volts.

There are two broad categories of ultrasound transmitters, digital and analog. The analog type takes a signal generated digitally and after being converted to analog form, by a digital to analog converter, the signal is amplified to the required higher voltage by a power amplifier. This type of transmitter is capable of generating complex waveforms by using a high-resolution digital to analog converter with a resolution of, for example, 12 bits. This technique is expensive and finds application in high-end ultrasound imaging systems.

Digital transmitters are simpler and less expensive than analog transmitters. Unfortunately, the semiconductor process technologies used to fabricate digital circuits do not typically accommodate the high voltages required to produce an acceptable signal-to-noise ratio in an ultrasound imager. Moreover, lower voltage processes are often faster and less expensive. Thus, an ultrasound transmitter compatible with low-voltage semiconductor processes is desirable.

SUMMARY

Various systems and methods for implementing a high-voltage ultrasound transmitter are disclosed herein. In accordance with at least some embodiments, an ultrasound transmitter includes a first plurality of drive transistors. A bias network is coupled to at least one transistor of the first plurality of drive transistors. A first switch is coupled to the bias network. The first switch selectively connects a first voltage to the bias network. The first switch is closed when generating an ultrasonic drive signal.

In accordance with at least some other embodiments, a method includes closing a first switch that connects a first power supply voltage to an ultrasound driver bias network. The bias network generates a bias voltage that substantially equalizes the voltage drop across a plurality of drive transistors.

In accordance with yet other embodiments, an ultrasound transmitter includes a plurality of drive transistors. A bias network substantially equalizes the voltages dropped across each of the plurality of drive transistors. A first driver drives at least a first transistor of the plurality of drive transistors. The first driver provides a buffered version of a first voltage generated by the bias network to at least the first transistor of the plurality of drive transistors.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The performance and cost efficiency of low voltage semiconductor processes make it desirable to use those processes to implement high voltage circuits. High voltage circuits can be so implemented by connecting transistors (e.g., field effect transistors ("FETs") in series (i.e., stacked), and in such a way as to ensure that the voltage across the transistors is distributed in a predictable manner. If transistors are stacked without considering voltage distribution, it may be possible for the voltage across an individual transistor to exceed the process specification. Moreover, a bias network that achieves predictable voltage distribution can result in undesirable power dissipation and/or poor switching performance. Embodiments of the present disclosure switch power to the bias network of a stacked transistor driver to reduce dissipation and employ drivers to buffer the bias voltages provided to the drive transistors, thus improving transmitter performance and advantageously reducing bias network power dissipation.

Figure 1:
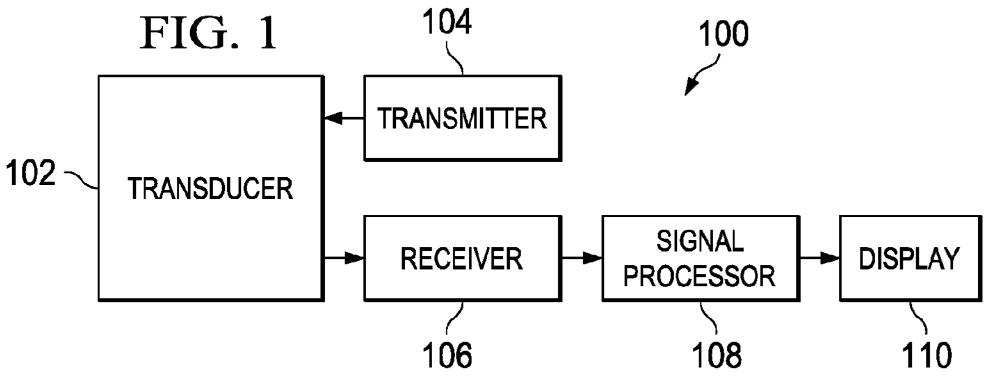
FIG. 1 shows a block diagram of an exemplary ultrasound imaging system in accordance with various embodiments.

FIG. 1 shows a block diagram of an exemplary ultrasound imaging system 100 in accordance with various embodiments. The terms "ultrasound" or "ultrasonic" generally refer to acoustic waves at frequencies beyond the range of human hearing (e.g., frequencies above 20 KHz). The system 100 comprises a transducer 102, a transmitter 104, a receiver 106, a signal processor 108, and a display 110. The transducer 102 converts the electrical drive signals generated by the transmitter 104 into sound waves (i.e., pressure waves) that are introduced into the subject to be imaged, for example, a human body when considering medical ultrasound. The transducer 102 can comprise a piezoelectric crystal, electromagnetic transducer, micro-electro-mechanical system ("MEMS") transducer or other device that converts an electrical signal into sound waves. Moreover, the transducer 102 can comprise one or more transducer elements. The transducer 102 also detects ultrasonic waves reflected by internal structures of the subject and converts the detected waves into electrical signals. In some embodiments, the same transducer elements are used to generate ultrasonic waves and to detect ultrasonic waves. In other embodiments, separate transducer elements are used for wave generation and detection.

The transmitter 104 is coupled to the transducer 102. The transmitter 104 produces an oscillating electrical signal at a frequency and amplitude suitable for generating acoustic waves (i.e., an ultrasonic drive signal) useful for imaging desired structures internal to the subject. For example, transmitter output signals for use in imaging the internal organs of a human body may range from 1 to 20 megahertz with lower frequencies providing lower resolution and greater imaging depth. The transmitter 104, while not limited to any particular signal amplitudes, may provide, for example, a drive signal amplitude in the range of +/−75 volts. The transmitter 104 employed in embodiments of the present disclosure advantageously uses transmitter circuitry that allows for efficient implementation of a high voltage ultrasonic driver on a low voltage semiconductor process, while reducing power dissipation and improving switching performance.

The receiver 106 is coupled to the transducer 102. As explained above, the transducer 102 detects ultrasonic waves reflected by subject internal structures. The transducer 102 converts the detected waves into electrical signals. The electrical signals are provided to the receiver 106. The receiver 106 performs initial processing of the received signals. Processing performed by the receiver 106 can comprise, for example, amplifying, filtering, digitizing, etc.

The signal processor 108 is coupled to the receiver 106. The signal processor 108 may, for example, provide further filtering of received signals, detect signal reflections, and prepare output signals for display on the display 110. The signal processor 108 may comprise, for example, a digital signal processor or other microprocessor or microcomputer and associated software programming along with attendant memory and interface devices, or dedicated hardware circuitry adapted to perform the processing functions. The display 110 may be a liquid crystal display, a cathode ray display, or any other suitable display device.

Figure 2:
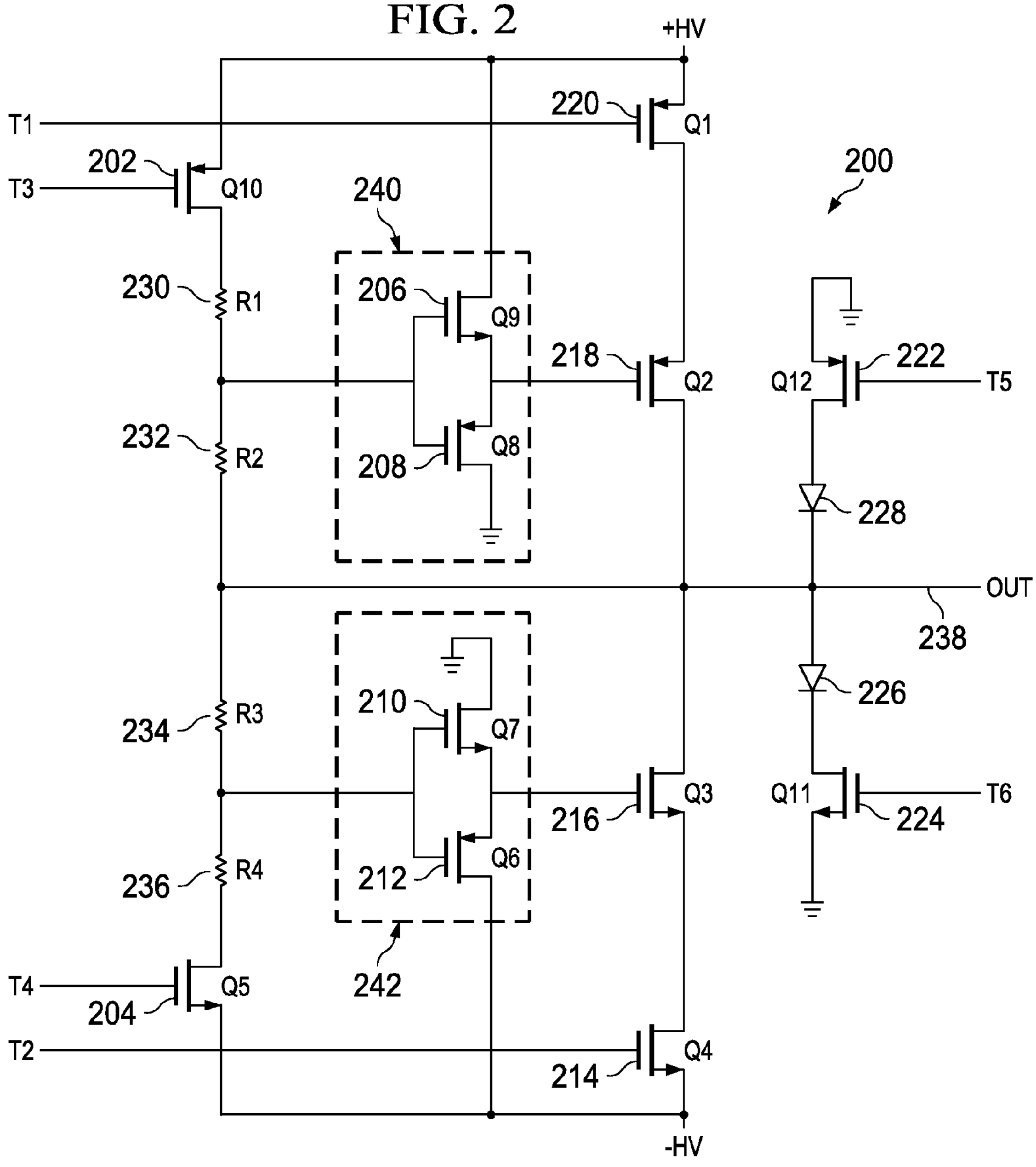
FIG. 2 shows an exemplary ultrasound transmitter circuit that provides a high voltage output with reduced power dissipation in accordance with various embodiments.

FIG. 2 shows exemplary ultrasound transmitter circuitry 200 that provides high-voltage ultrasonic drive signals while reducing power dissipation and enhanced switching performance. The transmitter 200 comprises drive transistors Q1 220, Q2 218, Q3 216, and Q4 214. When enabled, stacked drive transistors Q1 220 and Q2 218 conduct high voltage, +HV, onto the transmitter output 238. Similarly, stacked drive transistors Q3 216 and Q4 214 conduct high voltage, −HV, onto the transmitter output 238 when enabled. As explained above, voltage should be predictably distributed across each transistor of a set of stacked transistors. The bias network comprising resistors R1 230, R2 232, R3 234, and R4 236 ensures that voltage is approximately equally distributed across each transistor of transistor pair Q1 220 and Q2 218, and each transistor of transistor pair Q3 216, and Q4 214 to assure that the breakdown voltage of the transistors is not exceeded. In some embodiments, R1 230, R2 232, R3 234, and R4 236 are of approximately equal value. In some embodiments, for example, the voltage drop across a selected drive transistor may be within 10% of the voltage drop across the other drive transistor of the transistor pair.

In ultrasound applications, the duty cycle of the transmitter 200 can be low (i.e., the transmitter on time is short relative to the transmitter off time). For example, the transmitter 200 duty cycle may be in the range of 1% (i.e., on 1% of the time and off 99% of the time), so that even though the drive transistors 214, 216, 218, 220 may conduct a relatively large amount of current, the large amount of current is required for only a short period of time.

Transmitter 200 preferably comprises transistor switches Q10 202 and Q5 204 coupled in series with the resistors R1-R4 230-236 to connect voltages +HV and −HV to the bias resistor network. When the transmitter 200 is inactive (i.e., no ultrasonic drive signal is being generated), the switches Q10 202 and Q5 204 are open. Thus, if the transmitter 200 has a 1% duty cycle, then by opening switches Q10 202 and Q5 204 when no drive signal is required (e.g., 99% of the time) no current flows through the bias resistors R1-R4 230-236 resulting in a substantial reduction in transmitter 200 quiescent current.

The drive transistors, for example Q1 220 and Q2 218, can be very large to achieve a low on resistance. Correspondingly, the gate capacitance of large field effect transistors ("FETs") can also be very large. Transmitter 200 comprises buffer drivers 240, 242 to drive the gates of drive transistors Q2 218 and Q3 216 respectively. As shown in the illustrative embodiment of FIG. 2, buffer driver 240 can comprise complementary transistors Q8 208 and Q9 206, and buffer driver 242 can comprise complementary transistors Q6 212 and Q7 210. The buffer drivers 240, 242 provide current suitable to enable fast switching of the drive transistors Q2 218 and Q3 216. Ultrasound transmitter embodiments not incorporating drivers 240, 242 suffer from slower switching of the drive transistors Q2 218 and Q3 216 and consequently may not provide ultrasonic drive signals at frequencies as high as those produced by embodiments of the present disclosure.

The input capacitance of the buffers 240, 242 preferably is substantially lower than the gate capacitance of the drive transistors Q2 218 and Q3 216, for example, in some embodiments by approximately a factor of 20 or more. Consequently, in embodiments of the present disclosure, the values of resistors R1-R4 230-236 can be, for example, 20 times larger than in an embodiment without the drivers 240, 242. Furthermore, embodiments of the present disclosure allow for a reduction in the size of the switches Q5 204, Q10 202 because the switches Q5 204, Q10 202 need not source as much current to the bias network.

Transistors Q11 224, Q12 222, and diodes 226, 228 are part of a clamping circuit that, when enabled, shunts the transmitter output 238 to ground. In some embodiments, the clamping circuit is enabled when the transmitter 200 is not generating ultrasonic drive signals.

An ultrasonic drive signal is generated by the illustrative transmitter 200 as follows. The output clamp of the illustrative embodiment is disabled by turning off transistors Q11

224 and Q12 222. Switches Q5 204 and Q10 202 are closed to connect the +HV and −HV voltages to the bias network comprising resistors R1-R4 230-236, thus preferably biasing the stacked drive transistor pairs Q1 220, Q2 218 and Q3 216, Q4 214 to switch +HV and −HV. Q1 220 is turned on and Q4 214 is turned off to drive the output 238 to +HV. Q1 220 is turned off and Q4 214 is turned on to drive the output 238 to −HV. Thus, embodiments alternately turn Q1 220 and Q4 214 on and off at the desired frequency to generate an ultrasonic drive signal on output 238. Some embodiments activate the output clamp (transistors Q11 224 and Q12 222) between deactivation of Q1 220 and activation of Q4, and vice versa, to clamp the output 238 to ground between half-cycles. Some embodiments generate pulses of one polarity by repetitively enabling and disabling only one of Q1 220 and Q4 214 with clamping (at least one of Q11 224 and Q12 222 turned on) during the disabled intervals. During intervals when no ultrasonic drive signal is being generated, embodiments shunt the output 238 to ground by turning on transistors Q11 224 and Q12 222, and transmitter quiescent current is preferably reduced by opening bias network switches Q5 204 and Q10 202 in accordance with at least some embodiments.

Figure 3:
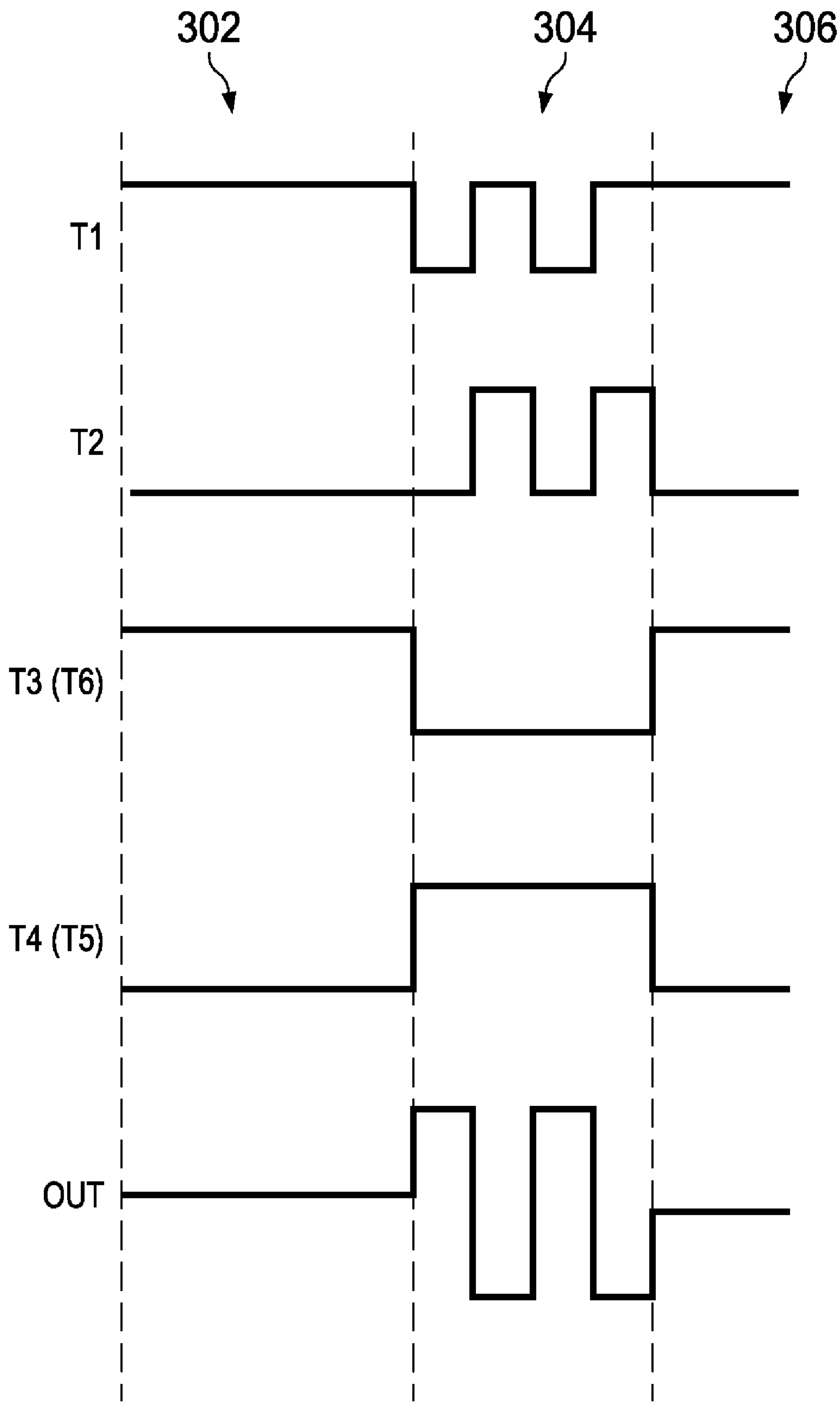
FIG. 3 shows a diagram of various signals produced when generating high voltage ultrasonic drive signals in accordance with various embodiments.

FIG. 3 shows a diagram of various signals produced when generating high voltage ultrasonic drive signals in accordance with various embodiments. The diagram begins, in period 302, with the transmitter driver 200 in shunt mode where embodiments clamp the output 238 to ground through diodes 226, 228 and transistors Q11 224 and Q12 222. Signals T5 and T6 are asserted to enable transistors Q12 222 and Q11 224 respectively. The signals T3 and T4 are preferably negated to maintain switches Q10 202 and Q5 204 in an open state to reduce transmitter 200 quiescent current. Because no drive signals are being generated, the signals T1 and T2 are negated, disabling drive transistors Q1 220 and Q4 214. Note that the states of signals T3 and T4 may be the same as those of signals T6 and T5 respectively, but the amplitudes of T3 and T4 may differ from the amplitudes of T6 and T5 because the voltage levels required to drive the switches Q10 202 and Q5 204 can differ from the voltages required to drive the clamp transistors Q11 224 and Q12 222.

Generation of a high voltage ultrasonic drive signal is shown in period 304. To produce the high voltage signal on the output 238, embodiments turn off the shunt transistors Q11 224 and Q12 222 by negating T6 and T5 as illustrated. Further, the bias network switches Q5 204 and Q10 202 are closed to provide voltage (e.g., +/−HV) to the bias network by asserting T4 and T3 as shown. Thereafter, embodiments toggle signals T1 and T2 as shown to alternately turn on and off high side drive transistor Q1 220 and low side drive transistor Q4 214 so that the output 238 is alternately driven near to +/−HV (some voltage is dropped across the driving transistors). As illustrated, embodiments generate a first half cycle of the ultrasonic drive signal by asserting T1 to turn on transistor Q1 220 while negating T2 to turn off transistor Q4 214. Embodiments generate a second half cycle of the ultrasonic drive signal by asserting T2 to turn on transistor Q4 214 while negating T1 to turn off transistor Q1 220. As many cycles of the signal as may be desired can be generated in this manner. In some embodiments, the output 238 is pulled to ground between the +HV half-cycle and the −HV half-cycle by asserting T5 and T6 to enable shunt transistors Q11 224 and Q12 222.

In period 306, which may occur between high voltage ultrasonic bursts or when generation of ultrasonic drive is terminated, the transmitter 200 preferably returns to shunt mode as described above. By negating signals T3 and T4, the bias network switches Q10 202 and Q5 204 are preferably opened during this period to reduce transmitter 200 power dissipation.

Figure 4:
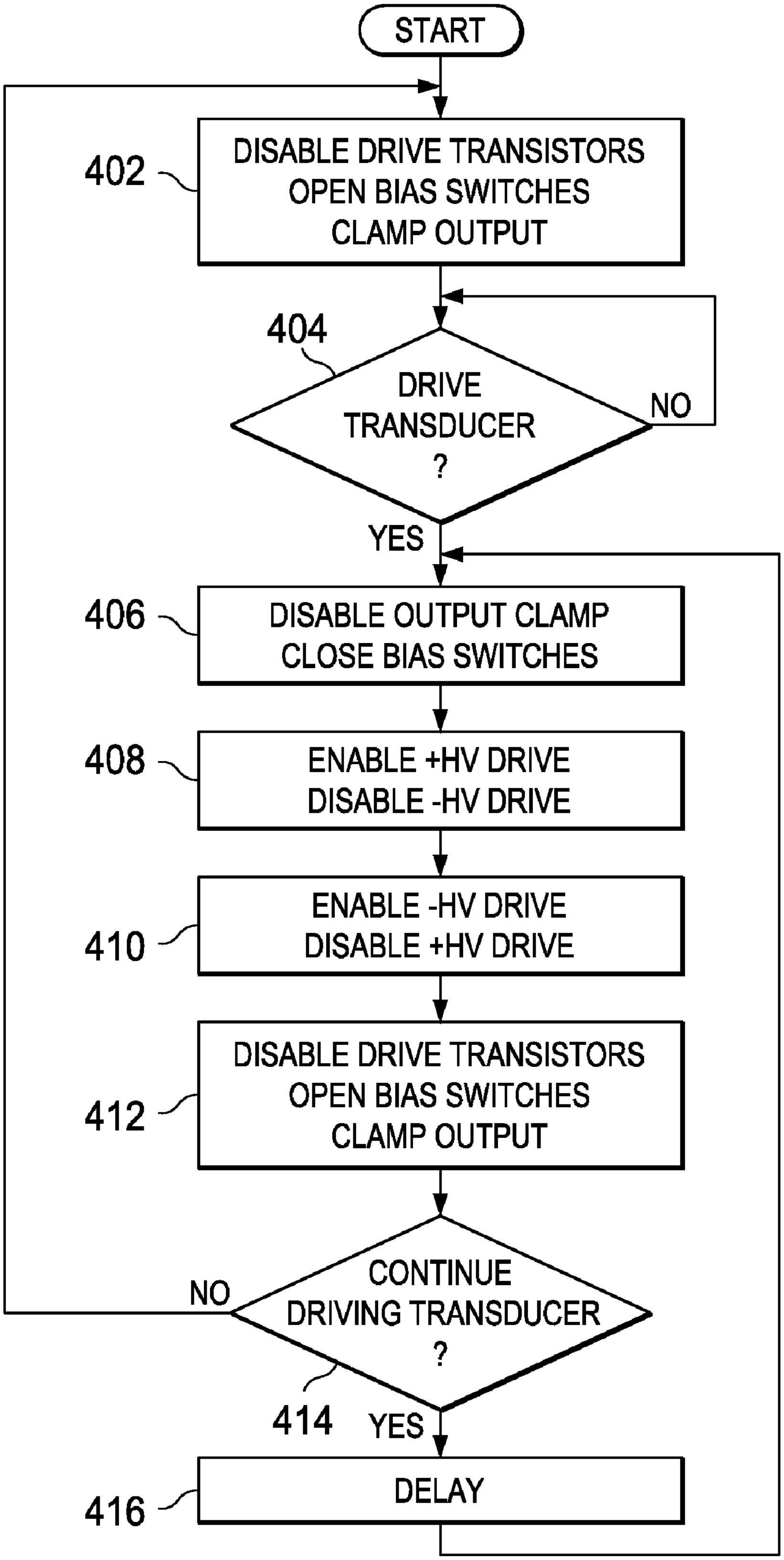
FIG. 4 shows a flow diagram for a method for generating high voltage ultrasonic drive signals in accordance with various embodiments.

FIG. 4 shows a flow diagram for a method for generating a high voltage ultrasonic drive signal in accordance with various embodiments. Though depicted sequentially as a matter of convenience, at least some of the actions shown can be performed in a different order and/or performed in parallel. Additionally, some embodiments may perform only some of the actions shown. In block 402, the transmitter 200 is producing no ultrasonic drive signal, and consequently the shunt mode is enabled. The clamp transistors, Q11 224 and Q12 222 are turned on to preferably clamp the output 238 to ground. The high voltage drive transistors Q1 220, Q2 218, Q3 216 and Q4 214 are turned off. The bias network switches Q10 202 and Q5 204 are open.

If transducer drive is requested, in block 404, then the clamp transistors Q11 224 and Q12 222 holding the output 238 to ground are turned off, and the switches Q10 202 and Q5 204 are closed to connect voltage (e.g., +/−HV) to the bias resistors R1-R4 230-236 in block 406. The bias network R1-R4 230-236 preferably substantially equalizes the voltage drop across the each pair of drive transistors Q1 220 and Q2 218, and Q3 216 and Q4 214.

In block 408, the first portion of the high voltage ultrasonic drive signal is generated. +HV drive is enabled by turning on drive transistor Q1 220 and −HV drive is disabled by turning off drive transistor Q4 214. The second portion of the high voltage ultrasonic drive signal is generated in block 410 where +HV drive is disabled by turning off drive transistor Q1 220 and −HV drive is enabled by turning on drive transistor Q4 214. Embodiments may repetitively perform the operations of blocks 408 and 410 to generate any number of cycles of the high voltage ultrasonic drive signal. In some embodiments, at least some of the operations of block 412 (e.g., disabling drive transistors and enabling output clamping) and block 406 (e.g., disabling output clamping) can be performed between block 408 and block 410 to produce a zero output between the +HV and −HV output drive. Furthermore, some embodiments can perform the operations of only one of blocks 408 and 410 in conjunction with blocks 406 and 412 to produce a drive signal oscillating between ground and either of +HV or −HV.

In block 412, the required number of high voltage cycles have been generated and ultrasonic drive is not required for at least a predetermined time period. The drive transistors Q1 220 and Q4 214 are preferably turned off to disable high voltage drive onto output 238. The bias switches Q5 204 and Q10 202 are opened to remove voltage across the bias resistors R1-R4 230-236 and preferably reduce transmitter 200 quiescent power consumption. As explained above the duty cycle of the high voltage transmitter may be approximately 1% in some embodiments, thus opening switches Q5 204 and Q10 202 can result in substantial power reduction. To discharge the output 238 (i.e., to clamp the output to ground), the clamp transistors Q11 224 and Q12 222 are turned on in some embodiments.

If, in block 414, transducer drive is to be continued, that is another ultrasonic signal burst is required, then after a predetermined time delay, in block 416, signal generation continues in block 406 as described above.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An ultrasound transmitter, comprising:

a first plurality of drive transistors;

a bias network coupled to at least one transistor of the first plurality of drive transistors; and a first switch coupled to the bias network, the first switch selectively connects a first voltage to the bias network;

wherein the first switch is closed when generating an ultrasonic drive signal.

2. The ultrasound transmitter of claim 1, further comprising:

a second plurality of drive transistors; and a second switch coupled to the bias network, the second switch selectively connects a second voltage to the bias network;

wherein at least one transistor of the second plurality of drive transistors is coupled to the bias network and the second switch is closed when generating the ultrasonic drive signal.

3. The ultrasound transmitter of claim 2, further comprising a first driver that couples the bias network to the at least one transistor of the second plurality of drive transistors.

4. The ultrasound transmitter of claim 1, wherein the first switch is open when the transmitter is not generating an ultrasonic drive signal.

5. The ultrasound transmitter of claim 1, further comprising a second driver that couples the bias network to the at least one transistor of the first plurality of drive transistors.

6. The ultrasound transmitter of claim 1, further comprising a clamping circuit that shunts a transmitter output node to ground when the first switch is open.

7. A method, comprising:

closing a first switch that connects a first power supply voltage to an ultrasound driver bias network;

generating a bias voltage in the bias network that substantially equalizes the voltage drop across a plurality of drive transistors; and generating an ultrasonic drive signal.

8. The method of claim 7, further comprising closing a second switch that connects a second power supply to the bias network.

9. The method of claim 7, further comprising driving at least one transistor of the plurality of drive transistors with a driver controlled by a first voltage produced by the bias network.

10. The method of claim 7, further comprising driving at least two transistors of the plurality of drive transistors each with a different driver controlled by a different voltage produced by the bias network.

11. The method of claim 7, further comprising clamping an ultrasonic transmitter output node to ground when the first switch is open.

12. The method of claim 7, further comprising opening the first switch when ultrasonic drive signal generation is disabled.

13. An ultrasound transmitter, comprising:

a plurality of drive transistors;

a bias network that substantially equalizes the voltages dropped across each of the plurality of drive transistors; and a first driver that drives at least a first transistor of the plurality of drive transistors;

wherein the first driver provides a buffered version of a first voltage generated by the bias network to at least the first transistor of the plurality of drive transistors.

14. The ultrasound transmitter of claim 13, further comprising a second driver that drives at least a second transistor of the plurality of drive transistors, wherein the second driver provides a buffered version of a second voltage generated by the bias network to at least the second transistor of the plurality of drive transistors.

15. The ultrasound transmitter of claim 13, further comprising a first switch that connects a first power supply voltage to the bias network.

16. The ultrasound transmitter of claim 15, further comprising a second switch that connects a second power supply voltage to the bias network.

17. The ultrasound transmitter of claim 15, wherein the first switch is open when the transmitter is not generating an ultrasonic drive signal.

18. The ultrasound transmitter of claim 13, wherein the first driver isolates the bias network from the input capacitance of at least the first transistor of the plurality of drive transistors.

19. The ultrasound transmitter of claim 13, wherein opening the first switch reduces the power dissipated in the bias network.

20. The ultrasound transmitter of claim 13, further comprising a clamping circuit that shunts a transmitter output node to ground when the first switch is open.

* * * * *